(12) United States Patent
Lin et al.

(10) Patent No.: US 9,536,818 B2
(45) Date of Patent: Jan. 3, 2017

(54) SEMICONDUCTOR PACKAGE AND METHOD OF FORMING THE SAME

(75) Inventors: Wei-Hung Lin, Xinfeng Township (TW); Ming-Da Cheng, Jhubei (TW); Chung-Shi Liu, Hsinchu (TW); Mirng-Ji Lii, Sinpu Township (TW); Chen-Hua Yu, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 143 days.

(21) Appl. No.: 13/272,434

(22) Filed: Oct. 13, 2011

(65) Prior Publication Data

US 2013/0093076 A1 Apr. 18, 2013

(51) Int. Cl.
*H01L 23/498* (2006.01)
*B23K 1/20* (2006.01)
*H01L 21/48* (2006.01)
*H01L 23/00* (2006.01)

(52) U.S. Cl.
CPC ..... *H01L 23/49894* (2013.01); *H01L 21/4864* (2013.01); *H01L 24/13* (2013.01); *H01L 24/16* (2013.01); *H01L 24/81* (2013.01); *H01L 2224/0401* (2013.01); *H01L 2224/05166* (2013.01); *H01L 2224/05181* (2013.01); *H01L 2224/05186* (2013.01); *H01L 2224/05647* (2013.01); *H01L 2224/13082* (2013.01); *H01L 2224/13111* (2013.01); *H01L 2224/13147* (2013.01); *H01L 2224/73204* (2013.01); *H01L 2224/81022* (2013.01); *H01L 2224/81191* (2013.01); *H01L 2224/81815* (2013.01); *H01L 2924/1305* (2013.01); *H01L 2924/13091* (2013.01)

(58) Field of Classification Search
USPC .......................................... 257/737
See application file for complete search history.

(56) References Cited

U.S. PATENT DOCUMENTS

| | | | | |
|---|---|---|---|---|
| 7,626,829 B2* | 12/2009 | Watanabe et al. | ............ | 361/767 |
| 8,353,103 B2* | 1/2013 | Watanabe et al. | ............ | 29/842 |
| 2006/0035453 A1* | 2/2006 | Kim et al. | .................... | 438/613 |
| 2006/0094223 A1* | 5/2006 | Tsai | ............... | 438/612 |
| 2009/0115036 A1* | 5/2009 | Shin | ............. | 257/673 |
| 2009/0197114 A1* | 8/2009 | Shih | ..................... | B23K 1/0016 428/647 |
| 2009/0233436 A1* | 9/2009 | Kim | ....................... | H01L 24/11 438/614 |
| 2009/0236756 A1* | 9/2009 | Kim | ................. | H01L 23/49838 257/778 |
| 2009/0294165 A1* | 12/2009 | Thomas | ............... | H05K 1/0206 174/263 |
| 2011/0074026 A1* | 3/2011 | Shim et al. | ................... | 257/737 |
| 2011/0084386 A1* | 4/2011 | Pendse | ............... | H01L 23/3178 257/737 |

* cited by examiner

*Primary Examiner* — Michael Lebentritt
*Assistant Examiner* — Jordan Klein
(74) *Attorney, Agent, or Firm* — Hauptman Ham, LLP

(57) ABSTRACT

A method of a semiconductor package includes providing a substrate having a conductive trace coated with an organic solderability preservative (OSP) layer, removing the OSP layer from the conductive trace, and then coupling a chip to the substrate to form a semiconductor package.

14 Claims, 3 Drawing Sheets

SEMICONDUCTOR PACKAGE AND METHOD OF FORMING THE SAME

BACKGROUND

Integrated circuit chips comprise semiconductor devices formed on a substrate, such as a semiconductor wafer, and include metalized contact, or attachment, pads for providing an electrical interface to the semiconductor devices. Bonding bumps are part of the interconnecting structure in an integrated circuit chip. A bump provides an interface to a semiconductor device of the integrated circuit chip through which an electrical connection to the device may be made. One of the techniques for providing a connection between the bumps of a chip and an external circuit, such as a circuit board, another chip, or a wafer, is wire bonding, in which wires are used to connect the chip contact pads to the external circuit. Another chip connection technique, known as flip chip technology, provides for connection of integrated circuit devices to an external circuit using solder bumps that have been deposited onto the chip contact pads. In order to mount the chip to external circuit, the chip is flipped over so that its top side faces down and its contact pads are aligned with matching contact pads on the external circuit. The solder is then flowed between the flipped chip and the substrate supporting the external circuit to complete the interconnection. The resulting flip chip package is much smaller than a traditional carrier-based system, because the chip is positioned directly on the external circuit. Also, the interconnect wires for flip-chip process may be much shorter and, as a result, the inductance and resistive heat are greatly reduced and the operation speed of the integrated circuit devices may be increased.

DETAILED DESCRIPTION

Figure 1:
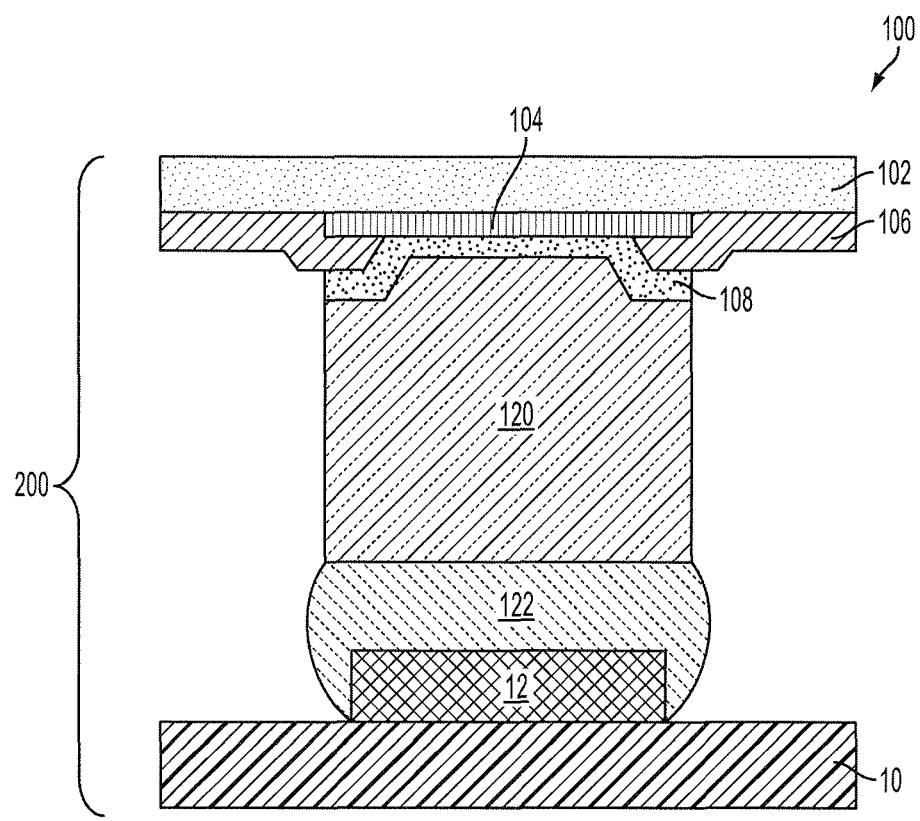
FIG. 1 is a cross-sectional view of a flip-chip package comprising a chip coupled to a substrate in accordance with an embodiment.

Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, apparatus in accordance with the present disclosure. It is to be understood that elements not specifically shown or described may take various forms well known to those skilled in the art.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIG. 1 is a cross-sectional view of a flip-chip package comprising a chip coupled to a substrate in accordance with an embodiment With reference to FIG. 1, a chip 100 is flipped upside down and attached to a substrate 10 through flip-chip bonding technologies so as to form a semiconductor package 200.

The chip 100 having an electrical circuit formed in and/or upon a semiconductor substrate 102 is shown. The semiconductor substrate 102 may be of any construction comprising semiconductor materials, including but not limited to, bulk silicon, a semiconductor wafer, a silicon-on-insulator (SOI) substrate, or a silicon germanium substrate. Other semiconductor materials, including group III, group IV, and/or group V semiconductors, may also be used. Although not shown, it will be recognized that the substrate 102 further comprises various microelectronic elements. Examples of the types of microelectronic elements that may be formed in the substrate 102 include, but are not limited to, transistors such as metal oxide semiconductor field effect transistors (MOSFETs), complementary metal oxide semiconductor (CMOS) transistors, bipolar junction transistors (BJTs), high voltage transistors, high frequency transistors, p-channel and/or n-channel field effect transistors (PFETs/NFETs), resistors, diodes, capacitors, inductors, fuses, and/or other suitable elements. The microelectronic elements are interconnected to form the integrated circuit device, which may comprise one or more of a logic device, memory device (e.g., SRAM), RF device, input/output (I/O) device, system-on-chip (SoC) device, and other suitable types of devices. The semiconductor substrate 102 further includes an interconnection structure including inter-layer dielectric layers and a metallization structure overlying the integrated circuits.

A conductive pad 104 is formed and patterned in or on a top-level inter-layer dielectric layer, which is a portion of conductive routes. The conductive pad 104 provides an electrical connection upon which a bump structure may be formed for facilitating external electrical connections. The conductive pad 104 may be formed of any suitable conductive materials, including one or more of copper (Cu), tungsten (W), aluminum (Al), AlCu alloys, silver (Al), and similar materials, for example. In some embodiments, the conductive pad 16 may be a region or an end of a redistribution line to provide the desired pin or ball layout. One or more passivation layers, such as a passivation layer 106, are formed and patterned over the conductive pad 104, such that a bump structure can be electrically connected to the conductive pad 104 through the opening in the passivation layer 106 for facilitating electrical connections. In at least one embodiment, the passivation layer 106 is formed of a non-organic material, such as un-doped silicate glass (USG), silicon nitride, silicon oxynitride, silicon oxide, or combinations thereof. In other embodiments, the passivation layer 106 may be formed of a polymer layer, such as an epoxy, polyimide, benzocyclobutene (BCB), polybenzoxazole (PBO), or the like, although other relatively soft, often organic, dielectric materials can also be used. One of ordinary skill in the art will appreciate that a single layer of conductive pads and a passivation layer are shown for illustrative purposes only. As such, other embodiments may include any number of stacked conductive pads and/or passivation layers.

A bump structure including the UBM layer 108 and the conductive pillar 120 is formed on the passivation layer 106 and electrically connected to the conductive pad 104 through the opening in the passivation layer 106. In at least one embodiment, the shape of the bump structure is elongated. Various shapes may be used to implement the elongated bump structure, including, but not limited to, a rectangle, a rectangle with at least one curved or rounded side, a rectangle with two convex curved sides, an oval, an ellipse or any other elongated shape. In another embodiment, the shape of the bump structure is circular. In some embodiments, the UBM layer 108 includes a diffusion barrier layer or a glue layer, which may comprise titanium (Ti), tantalum (Ta), titanium nitride (TiN), tantalum nitride (TaN), or the like and be formed by PVD or sputtering. The UBM layer 108 may further include a seed layer formed on the diffusion barrier layer by PVD or sputtering. The seed layer may be formed of copper (Cu) or copper alloys including Al, chromium (Cr), nickel (Ni), tin (Sn), gold (Ag), or combinations thereof. In at least one embodiment, the UBM layer 108 includes a Ti layer and a Cu seed layer. In some embodiments, the conductive pillar 120 includes a Cu layer. The Cu layer comprises pure elemental copper, copper containing unavoidable impurities, and/or copper alloys containing minor amounts of elements such as Ta, indium (In), Sn, zinc (Zn), manganese (Mn), Cr, Ti, germanium (Ge), strontium (Sr), platinum (Pt), magnesium (Mg), aluminum (Al) or zirconium (Zr). The conductive pillar 120 may be formed by sputtering, printing, electroplating, electro-less plating, electrochemical deposition (ECD), molecular beam epitaxy (MBE), atomic layer deposition (ALD), and/or commonly used CVD methods. In one embodiment, the Cu layer is formed by electro-chemical plating (ECP). In an exemplary embodiment, the thickness of the conductive pillar 120 is greater than 20 μm. In another exemplary embodiment, the thickness of the conductive pillar 120 is greater than 40 μm. For example, the conductive pillar 120 is of about 20~50 μm thickness, or about 40~70 μm thickness, although the thickness may be greater or smaller. In alternative embodiments, the bump structure includes a solder layer 122 formed on the conductive pillar 120. In some embodiments, the solder layer 122 has a thickness about 1~5 μm. In at least one embodiment, the solder layer 122 is made of a lead-free solder material, such as Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, SnAgSb, or other similarly appropriate material.

The bump structures of the chip 100 are electrically coupled to conductive traces 12 of the substrate 10, forming a semiconductor package 200. An exemplary coupling process includes a flux application, chip placement, reflowing of melting solder joints, and/or cleaning of flux residue. A high temperature process, such as reflow or thermal compression bonding, may be performed to melt the solder material between the conductive pillar 120 and the conductive trace 12. The melted solder layer thus joins the chip 100 and the substrate 10 together and electrically connects the elongated bump structure to the conductive trace 12. A reflowed region formed by melting the solder layer 122 is also referred to as a solder joint region 122. The conductive pillar 120 coupled to the conductive trace 12 and thus forms a bump-on-trace (BOT) interconnection in the semiconductor package 200. After the solder jointing, a mold underfill (not shown) may be filled into the space between chip 100 and substrate 10, and thus the mold underfill is also filled into the space between neighboring conductive traces. Alternatively, no mold underfill is provided in the semiconductor package 200.

In at least one embodiment, an organic solderability preservative (OSP) layer is removed from the conductive traces 12 before coupling the chip 100 to the substrate 10, the adhesion force is enhanced between the solder joint region 122 and the conductive trace 12 and the risk of cold joint failure is therefore decreased. In at least one embodiment, the semiconductor package 200 is free of the OSP layer on the conductive trace 12.

Figure 2:
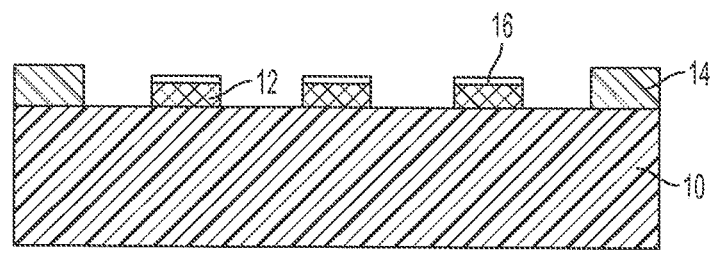
FIGS. 2 and 3 are cross-sectional views of intermediate stages in the manufacturing of a substrate in accordance with an embodiment.
Figure 3:
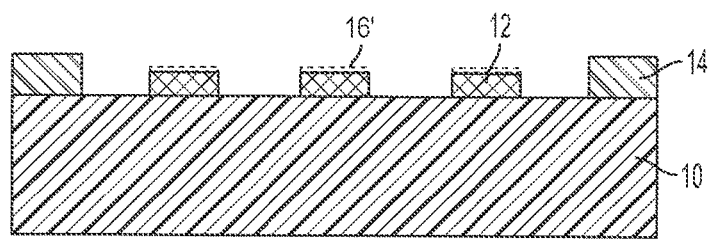

FIGS. 2-3 are cross-sectional views of intermediate stages in the manufacturing of a substrate in accordance with an embodiment.

FIG. 2 depicts a cross-sectional diagram illustrating a portion of the substrate 10. In an embodiment, the substrate 10 is a substrate on which a die, a wafer, an interposer or a die stack will be attached. In some embodiments, the substrate 10 is formed of a dielectric material, an organic material, a plastic or ceramic material, a silicon material or the like. The substrate 10 may function as a package substrate, a print circuit board, a mother board, a daughter board or the like. Alternatively the substrate 10 may comprise other materials and dimensions. The substrate 10 includes a plurality of conductive traces 12 electrically connected to underlying metal interconnection (not shown). The conductive traces 12 may be formed of substantially pure copper (Cu), AlCu, or other metallic materials such as tungsten (W), nickel (Ni), palladium (Pd), gold (Au), or alloys thereof. Some areas of the conductive traces 12 are defined as landing pad regions for electrically connecting to bump structures. In at least one embodiment, a mask layer 14 is formed and patterned on the substrate 10, while at least some portions of the conductive traces 12 are not covered. In at least one embodiment, the exposed portions of the conductive traces 12 function as landing pad regions, respectively. The mask layer 14 may be formed of a solder resist material layer, a dielectric layer, a polymer layer, or any other materials that are resistant to solder materials.

FIG. 2 also shows an organic solderability preservative (OSP) layer 16 coated on the conductive traces 12. In at least one embodiment, the OSP layer 16 includes benzotriazole, benzimidazoles, or combinations and derivatives thereof. In at least one embodiment, the OSP coating is applied by immersing the metal surface in an OSP solution which may contain alkylimidazole, benzotriazole, rosin, rosin esters, or benzimidazole compounds. Alternatively, the OSP coating is made with phenylimidazole or other imidazole compounds including 2-arylimidazole as the active ingredient. In some embodiments, the OSP layer 16 selectively protects the bare metal, such as the metal of the conductive traces 12, from oxidation.

In order to prevent the cold joint issues from the OSP residues remaining on the conductive traces 12, a cleaning process is performed to remove the OSP layer 16 prior to coupling a chip on the substrate 10. With reference to FIG. 3, there is shown a cross-sectional diagram illustrating a portion of the substrate 10. In at least one embodiment, a cleaning process 18 is performed to remove the OSP layer 16 from the conductive trace 16. In at least one embodiment, the cleaning process 18 is an acid cleaning process, which uses acid including at least one of $H_2SO_4$, $HNO_3$ or NaOH applied by horizontal spraying or vertical dipping process. For example, in the use of a solution containing 1~20% $H_2SO_4$, the cleaning process is performed at about 60 for about 20~30 seconds. In another example of the use of a solution containing 1~15% $HNO_3$, the cleaning process is performed at about 60 degree C. for about 20~30 seconds. In another example using a solution containing 1~20% NaOH, the cleaning process is performed at about 60 degree C. for about 20~30 seconds. In some embodiments, the OSP layer 16 is completely removed. In some embodiments, the OSP layer 16 is partially removed, and the OSP layer 16' remaining on the conductive traces 12 is less than 0.3 μm in thickness.

Figure 4:
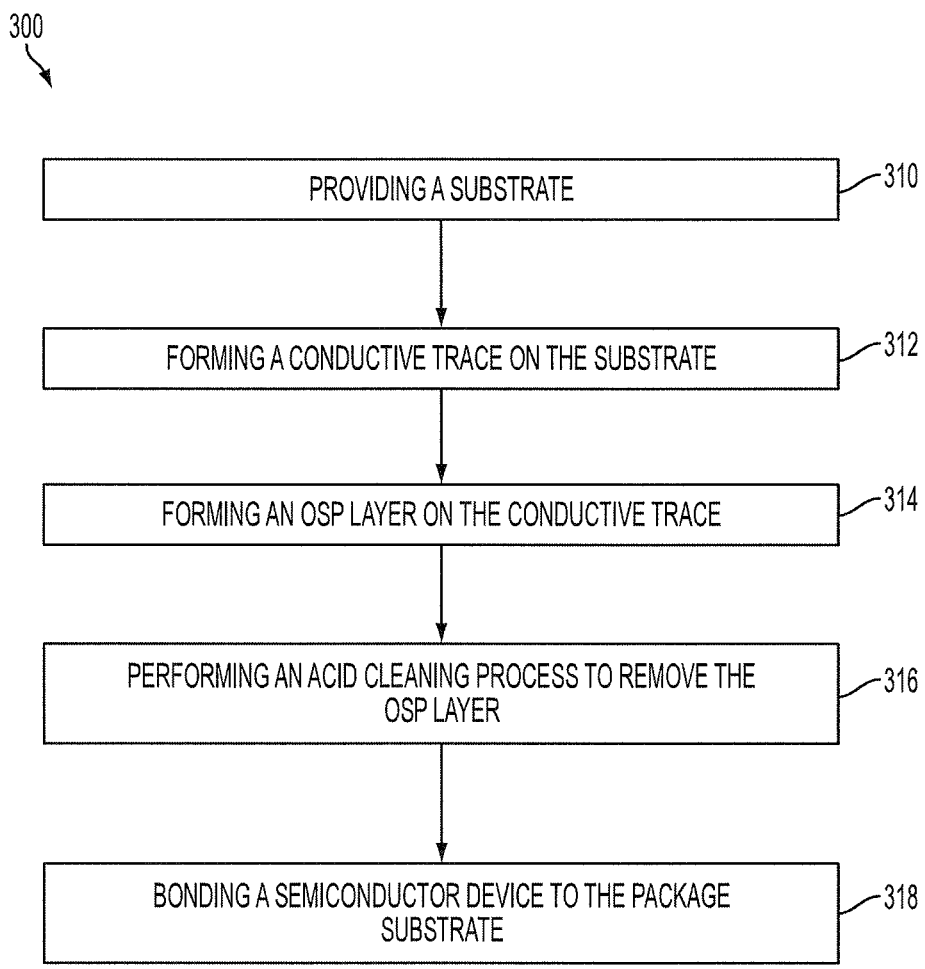
FIG. 4 is a flow chart of a method of fabricating a semiconductor package according to various aspects of the present disclosure.

FIG. 4 is a flow chart of the method of fabricating a substrate according to various aspects of the present disclosure. The method 300 begins with block 310 in which a substrate is provided. The method 300 continues with block 312 in which a conductive trace is formed on the substrate. The method 300 continues with block 314 in which an OSP layer is formed on the conductive trace. The method 300 continues with block 316 in which an acid cleaning process is performed to remove the OSP layer from the conductive traces. The method 300 continues with block 318 in which a chip is electrically coupled to the substrate. In at least one embodiment, the chip comprises a bump structure couple to the conductive trace to form a BOT interconnection in a semiconductor package. In some embodiments, the bump structure is an elongated bump structure including an UBM layer and a conductive pillar, and a solder layer is formed on the conductive pillar. In some embodiments, the elongated bump structure is coupled to the conductive trace by forming a solder joint region between the elongated bump structure and the conductive trace. Since the OSP layer is partially or completely removed from the conductive traces before coupling the chip to the substrate, the adhesion force is enhanced between the solder joint region and the conductive trace and the cold joint issue is therefore prevented. In at least one embodiment, the chip is coupled to the substrate without an OSP layer on the conductive trace.

In according with one aspect of the exemplary embodiment, a method of forming a semiconductor package includes providing a substrate having a conductive trace coated with an organic solderability preservative (OSP) layer, removing the OSP layer from the conductive trace, and then coupling a chip to the substrate to form a semiconductor package.

In accordance with another aspect of the exemplary embodiment, a method of forming a package substrate includes providing forming a conductive trace on a substrate, forming an organic solderability preservative (OSP) layer on the conductive trace, and removing the OSP layer from the conductive trace.

In accordance with another aspect of the exemplary embodiment, a semiconductor package includes a substrate having a conductive trace and a chip having a bump structure. The bump structure is coupled to the conductive trace to form a bump-on-trace (BOT) interconnection in the semiconductor package. The semiconductor package is free of an organic solderability preservative (OSP) layer between the bump structure and the conductive trace.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of inventive concepts as expressed herein.

What is claimed is:

1. A semiconductor package, comprising:
   a substrate comprising a conductive trace, the conductive trace projecting outwardly from the substrate and in contact with a solder material, wherein a planar surface of the conductive trace is in direct contact with the solder material; and
   a chip comprising a bump structure electrically coupled to an under bump metal layer, the bump structure providing the solder material and being coupled to the conductive trace to form a bump-on-trace (BOT) interconnection in the semiconductor package,
   wherein a portion of the planar surface of the conductive trace is in direct contact with an organic solderability preservative (OSP) layer, the planar surface is partially free of the OSP layer, and the OSP layer has a thickness less than about 0.30 microns (μm).

2. The semiconductor package of claim 1, wherein the bump structure of the chip comprises an elongated bump shape.

3. The semiconductor package of claim 1, wherein the bump structure of the chip comprises a conductive pillar.

4. The semiconductor package of claim 3, wherein the bump structure of the chip comprises a solder layer on the conductive pillar.

5. The semiconductor package of claim 3, wherein the conductive pillar comprises copper.

6. The structure of claim 3, wherein the conductive pillar has a thickness greater than 20 microns (μm).

7. The structure of claim 1, wherein the OSP layer comprises one or more of a benzotriazole, a benzimidazole, a benzotriazole-derivative, or a benzimidazole-derivative.

8. A semiconductor package comprising:
   a substrate;
   a conductive trace on the substrate, the conductive trace having a substantially planar surface;
   a solder layer bonded to the conductive trace, the substantially planar surface of the conductive trace being partially free of an organic solderability preservative (OSP) layer; and
   a chip bonded to the solder layer, the chip comprising:
     a chip substrate;
     a conductive pad on the chip substrate;
     a conductive pillar on the conductive pad, the conductive pillar bonded to the solder layer; and
     an under bump metallurgy (UBM) layer between the conductive pillar and the conductive pad,
     wherein the OSP layer has a thickness less than about 0.30 microns (μm).

9. The semiconductor package of claim 8, wherein the UBM layer comprises:
   a diffusion barrier layer; and
   a seed layer between the diffusion barrier layer and the conductive pillar.

10. The semiconductor package of claim 8, further comprising a passivation layer, wherein the passivation layer is between a portion of the conductive pad and the UBM layer, and the UBM layer contacts the conductive pad through an opening in the passivation layer.

11. The semiconductor package of claim 8, wherein the conductive pillar has a thickness greater than 20 microns (μm).

12. The semiconductor package of claim 8, wherein the solder layer comprises a lead-free solder material.

13. The semiconductor package of claim 8, wherein the chip further comprises microelectronic elements.

14. The semiconductor package of claim 8, wherein the conductive pillar comprises copper.

* * * * *